United States Patent
Cho et al.

(10) Patent No.: US 9,291,860 B2
(45) Date of Patent: Mar. 22, 2016

(54) DISPLAY DEVICE INCLUDING SEALANT AND MANUFACTURING METHOD THEREOF

(71) Applicant: SAMSUNG DISPLAY CO., LTD., Yongin, Gyeonggi-Do (KR)

(72) Inventors: Sung Ho Cho, Seoul (KR); Mi Jin Yoon, Daegu (KR); Yong-Je Jeon, Asan-si (KR)

(73) Assignee: Samsung Display Co., Ltd., Yongin-Si (KR)

(*) Notice: Subject to any disclaimer, the term of this patent is extended or adjusted under 35 U.S.C. 154(b) by 56 days.

(21) Appl. No.: 14/188,518

(22) Filed: Feb. 24, 2014

(65) Prior Publication Data

US 2015/0060893 A1  Mar. 5, 2015

(30) Foreign Application Priority Data

Sep. 3, 2013 (KR) .................. 10-2013-0105392

(51) Int. Cl.
*H01L 51/52* (2006.01)
*H01L 51/56* (2006.01)
*G02F 1/1339* (2006.01)

(52) U.S. Cl.
CPC ............ *G02F 1/1339* (2013.01); *H01L 51/525* (2013.01); *H01L 51/5246* (2013.01)

(58) Field of Classification Search
CPC ... H01L 51/107; H01L 51/56; H01L 51/5246; H01L 51/525
See application file for complete search history.

(56) References Cited

U.S. PATENT DOCUMENTS

| 7,800,303 B2* | 9/2010 | Logunov et al. ............ 313/512 |
| 8,446,346 B2 | 5/2013 | Jeong et al. |
| 8,456,085 B2 | 6/2013 | Han |
| 2007/0176550 A1* | 8/2007 | Kwan ........................ 313/512 |
| 2010/0099323 A1 | 4/2010 | Zu et al. |

FOREIGN PATENT DOCUMENTS

| KR | 10-0688790 | 3/2007 |
| KR | 10-1107172 | 1/2012 |
| KR | 10-1147421 | 5/2012 |
| KR | 10-2012-0136697 | 12/2012 |

* cited by examiner

*Primary Examiner* — Evan Pert
(74) *Attorney, Agent, or Firm* — Lewis Roca Rothgerber Christie LLP

(57) ABSTRACT

A display device includes a lower substrate; an upper substrate facing the lower substrate; a display element layer in a display area of the lower substrate and including a thin film transistor; and a sealing body in a peripheral area surrounding the display area, having a closed curve shape, and between the lower substrate and the upper substrate, in which the sealing body includes a first portion and a second portion, the first portion and the second portion respectively extending along different directions from each other, and the first portion and the second portion respectively have different deposition structures from each other.

18 Claims, 24 Drawing Sheets

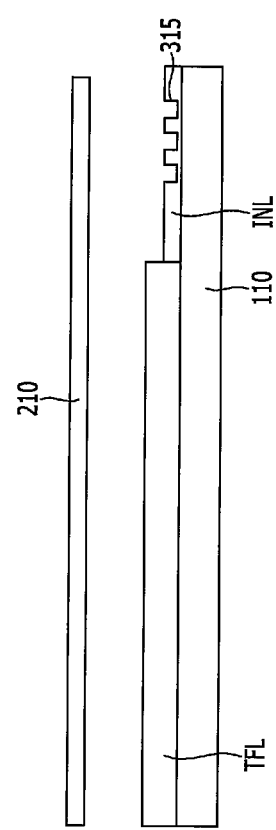

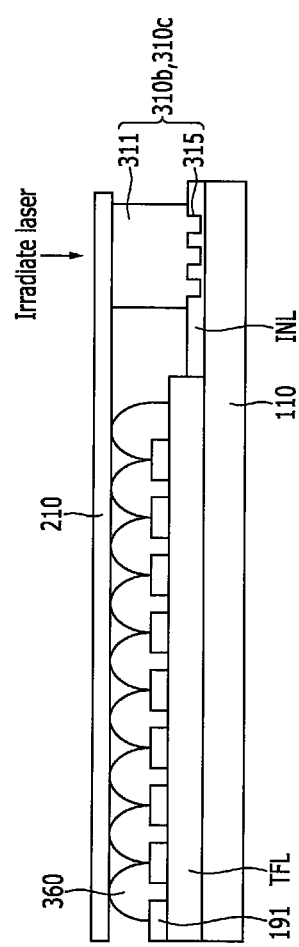

DISPLAY DEVICE INCLUDING SEALANT AND MANUFACTURING METHOD THEREOF

CROSS-REFERENCE TO RELATED APPLICATION

This application claims priority to and the benefit of Korean Patent Application No. 10-2013-0105392, filed in the Korean Intellectual Property Office on Sep. 3, 2013, the entire contents of which are incorporated herein by reference.

BACKGROUND

1. Field

The present invention relates generally to a display device including a sealant and a manufacturing method thereof, and more particularly, to a display device and a manufacturing method thereof capable of reducing or preventing a Newton's ring phenomenon.

2. Description of the Related Art

A display device, such as a liquid crystal display (LCD), an organic light emitting diode (OLED) display, and an electro-phoretic display, includes a field generating electrode and an electro-optical active layer. For example, the organic light emitting diode (OLED) display includes an organic light emitting layer as the electro-optical active layer. The field generating electrode is connected to a switching element, such as a thin film transistor, to receive a data signal, and the electro-optical active layer converts the data signal to an optical signal to display an image.

Among the display devices, because the organic light emitting diode (OLED) display, as a self-light emitting display, does not require a separate light source, its characteristics, in terms of power consumption, response speed, viewing angle, and contrast ratio, are excellent.

The organic light emitting diode (OLED) display may include a plurality of pixels such as red pixels, blue pixels, green pixels, or white pixels, and may express a full range of colors by combining the pixels. Each pixel includes an organic light emitting element and a plurality of thin film transistors for driving the organic light emitting element.

The light emitting element of the organic light emitting diode (OLED) display includes a pixel electrode, an opposed electrode, and a light emitting layer positioned between the two electrodes. One of the pixel electrode and the opposed electrode becomes an anode, and the other electrode becomes a cathode. An electron injected from the cathode and a hole injected from the anode are coupled with each other in the light emitting layer to form an exciton, and the exciton emits light while discharging energy. The opposed electrode is formed throughout a plurality of pixels to transfer a common voltage (e.g., a predetermined common voltage).

In a display device, in addition to the organic light emitting diode (OLED) display, when impurities such as moisture or oxygen flow or penetrate into the display device from an ambient environment, oxidization, exfoliation, and the like of the electrode may occur, and as a result, a lifespan of the device may be shortened or light emission efficiency may deteriorate, and effects such as deformation of an emitted color may occur.

Accordingly, when the display device is manufactured, sealing is performed so that an internal element is separated or protected from the outside to prevent impurities, such as moisture, from penetrating therein. The sealing method, in the case of the organic light emitting diode (OLED) display, may include, for example, a method of laminating a layer made of organic polymer such as polyester (PET) on a completed lower substrate, a method of forming a cover or a cap on an encapsulation substrate and sealing an edge of a cover substrate with a sealant, or the like. A frit having excellent moisture prevention characteristics may be included in the sealant, and an organic sealant and moisture absorbent may also be utilized.

The above information disclosed in this Background section is only for enhancement of understanding of the background of the invention and therefore it may contain information that does not form the prior art that is already known in this country to a person of ordinary skill in the art.

SUMMARY

In the display device including the sealant, when a distance between the lower substrate and the encapsulation substrate is not regular, light incident from the outside causes an optical interference phenomenon that generates a concentric circular pattern at a contact point between the encapsulation substrate and the lower substrate. Such a concentric circular pattern is called a Newton's ring. For example, when the sealant includes the frit, the lower substrate and the encapsulation substrate are bonded to each other and then adhered to each other by applying heat to the sealant, and in this case, according to the application of heat, a thickness of the sealant may vary according to a position around the display device. In this case, the distance between the lower substrate and the encapsulation substrate is not regular and thus the Newton's ring may be generated. The Newton's ring may negatively affect visibility during driving of the display device and image quality.

Accordingly, aspects of embodiments of the present invention are directed toward a display device and a manufacturing method thereof having enhanced image quality by preventing or reducing a Newton's ring phenomenon.

According to an example embodiment of the present invention, a display device includes a lower substrate; an upper substrate facing the lower substrate; a display element layer in a display area of the lower substrate and including a thin film transistor; and a sealing body in a peripheral area surrounding the display area, having a closed curve shape, and between the lower substrate and the upper substrate, in which the sealing body includes a first portion and a second portion, the first portion and the second portion respectively extending in different directions from each other, and the first portion and the second portion respectively have different deposition structures from each other.

The sealing body may include a sealant coupling the lower substrate and the upper substrate, and the sealant included in the first portion and the sealant included in the second portion may be different in height from each other.

The first portion may include a first pattern and the second portion may not include the first pattern.

The first pattern may include a pattern that is at least one layer of the display element layer.

The first pattern may include a layer that is at least one of a conductive layer, a semiconductor layer, and an insulating layer, and the conductive layer, the semiconductor layer, and the insulating layer may be in the display element layer.

The sealant at the first portion may be less in height than that of the sealant at the second portion.

The first portion and the second portion may each further include a second pattern including a metal.

The sealant may include a frit.

A peripheral insulating layer may be between the sealant and the lower substrate, in which the peripheral insulating layer may be at least one insulating layer of the display element layer, and the first pattern may include an opening in the peripheral insulating layer.

According to another example embodiment of the present invention, a manufacturing method of a display device includes providing a lower substrate and an upper substrate that include a display area and a peripheral area around the display area; and forming a sealing body between the lower substrate and the upper substrate, the sealing body having a closed curve shape surrounding the display area and positioned in the peripheral area, in which the sealing body includes a first portion and a second portion, the first portion and the second portion respectively extending along different directions from each other, and the first portion and the second portion respectively have different deposition structures from each other.

The forming of the sealing body may include coating a sealant to couple the lower substrate and the upper substrate with each other on the lower substrate or the upper substrate, and curing the sealant, in which the cured sealant at the first portion and the cured sealant at the second portion may be different in height from each other.

The forming of the sealing body may also include forming a first pattern in the first portion but not in the second portion.

The manufacturing method of a display device may also include forming a display element layer including a thin film transistor in the display area of the lower substrate, in which the first pattern may be formed utilizing a same process as at least one layer of the display element layer.

The first pattern may include a layer that is at least one of a conductive layer, a semiconductor layer, and an insulating layer, and the conductive layer, the semiconductor layer, and the insulating layer are in the display element layer.

After the curing of the sealant, the sealant at the first portion may be less in height than that of the sealant at the second portion.

The forming of the display element layer may include forming a peripheral insulating layer between the sealant and the lower substrate, the peripheral insulating layer may be at least one insulating layer of the display element layer, and the first pattern may have an opening in the peripheral insulating layer.

The first pattern may be formed when the at least one insulating layer of the display element layer is patterned.

The sealant may include a frit.

According to aspects of the example embodiment of the present invention, it is possible to enhance image quality by preventing a Newton's ring phenomenon.

BRIEF DESCRIPTION OF THE DRAWINGS

FIGS. 21 to 24 are cross-sectional views illustrating intermediate acts of a manufacturing method of a display device according to an example embodiment of the present invention.

DETAILED DESCRIPTION

Figure 1:
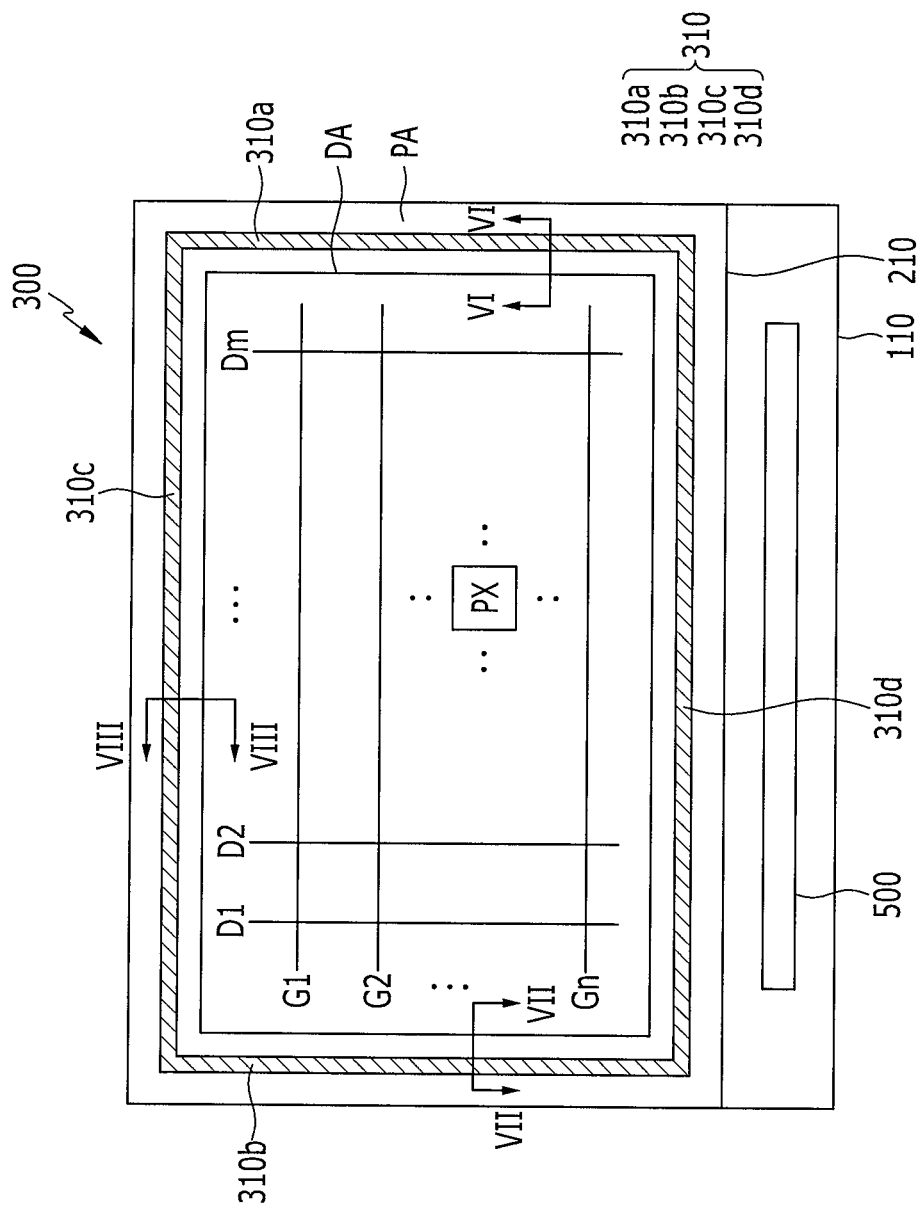
FIG. 1 is a plan view of a display device according to an example embodiment of the present invention.

The present invention will be described more fully hereinafter with reference to the accompanying drawings, in which example embodiments of the invention are shown. As those skilled in the art would realize, the described embodiments may be modified in various different ways, all without departing from the spirit or scope of the present invention.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it may be directly on the other element or intervening elements may also be present. In contrast, when an element is referred to as being "directly on" another element, there are no intervening elements present. Expressions such as "at least one of," when preceding a list of elements, modify the entire list of elements and do not modify the individual elements of the list. As used herein, the term "and/or" includes any and all combinations of one or more of the associated listed items. Further, the use of "may" when describing embodiments of the present invention refers to "one or more embodiments of the present invention."

First, a display device according to an example embodiment of the present invention will be described with reference to FIGS. 1 to 4.

Figure 2:
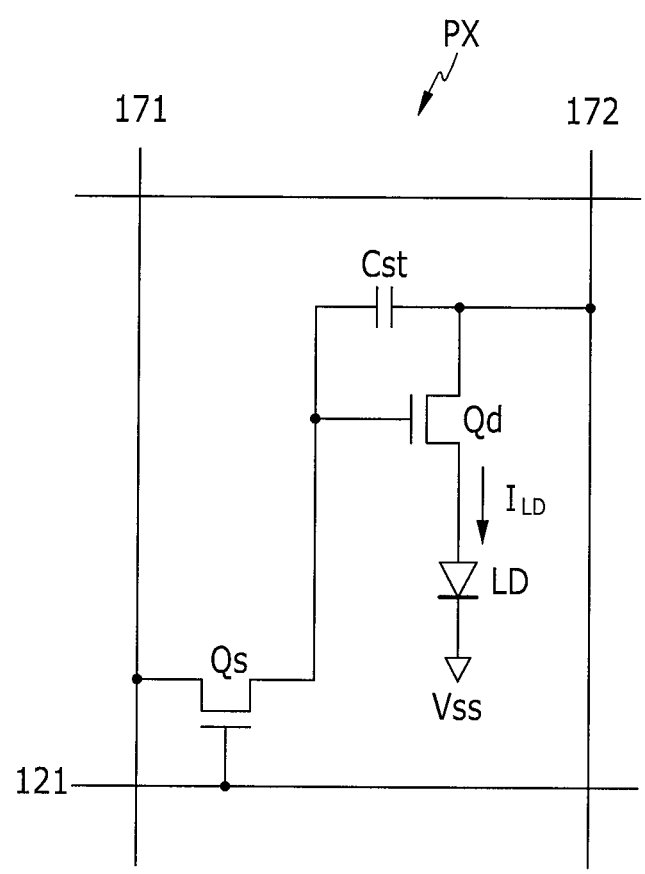
FIG. 2 is a schematic circuit diagram of one pixel of the display device according to the example embodiment of the present invention.
Figure 3:
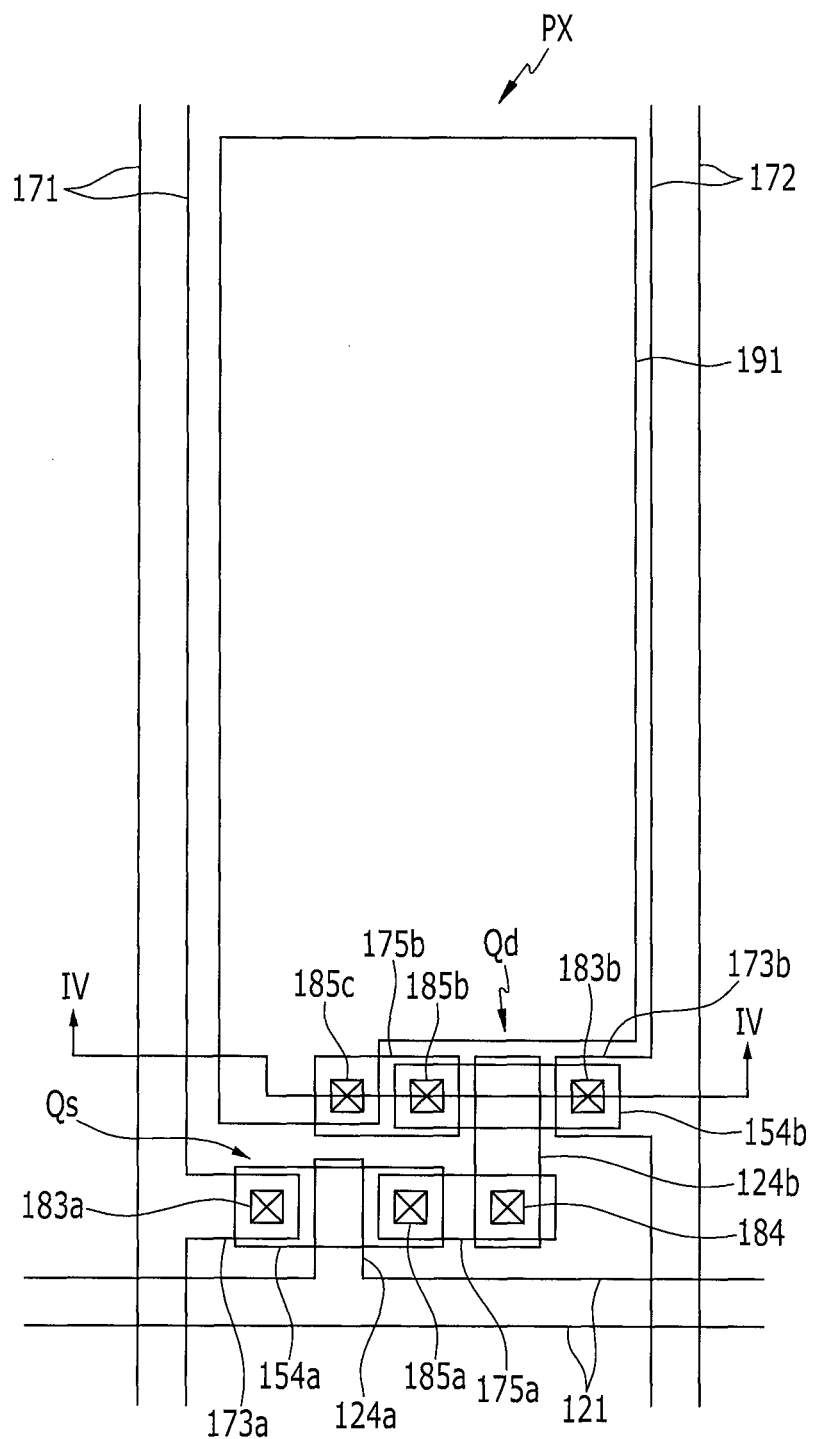
FIG. 3 is a layout view of one pixel of the display device according to the example embodiment of the present invention.
Figure 4:
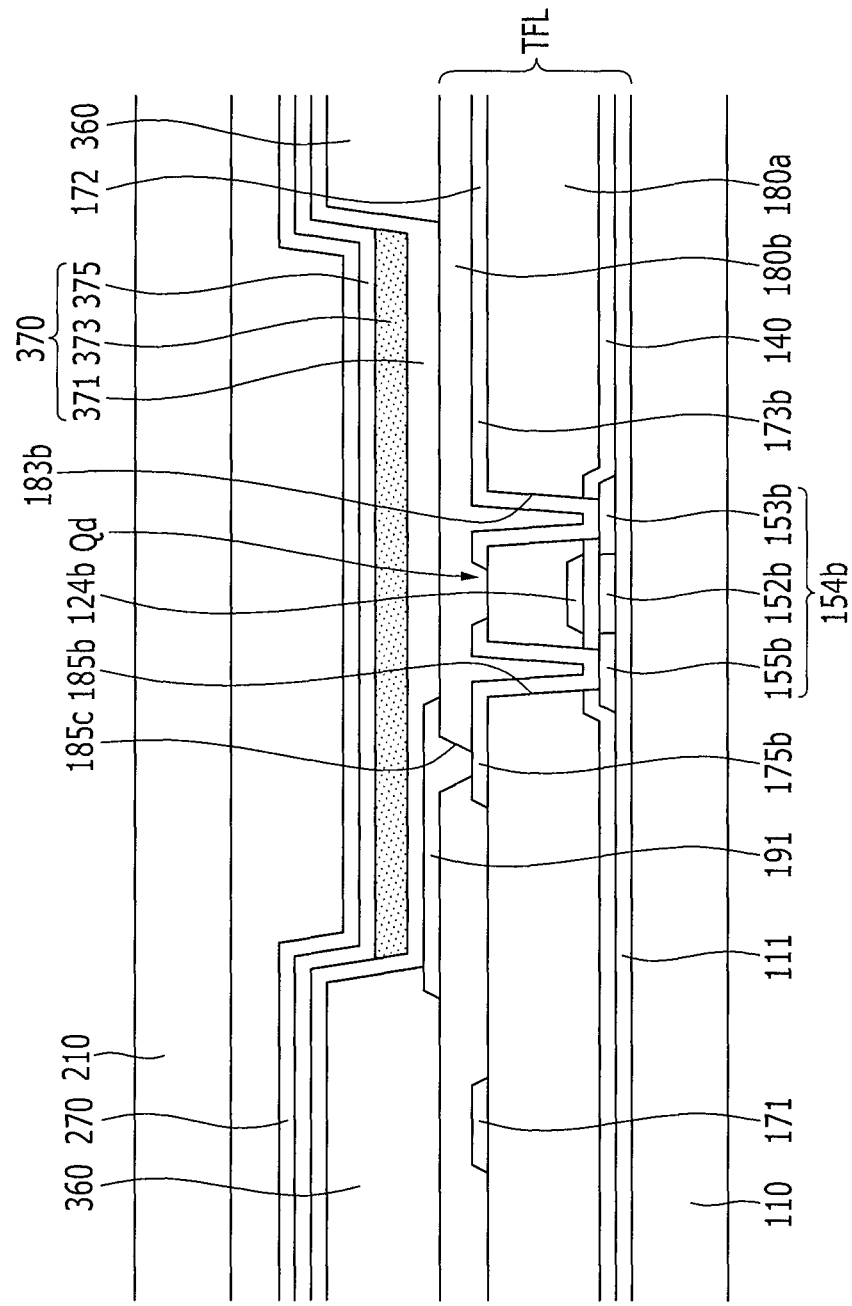
FIG. 4 is a cross-sectional view of the display device of FIG. 3 taken along the line IV-IV.

FIG. 1 is a plan view of a display device according to an example embodiment of the present invention, FIG. 2 is a schematic circuit diagram of one pixel of the display device according to the example embodiment of the present invention, FIG. 3 is a layout view of one pixel of the display device according to the example embodiment of the present invention, and FIG. 4 is a cross-sectional view of the display device of FIG. 3 taken along the line IV-IV.

First, referring to FIG. 1, a display panel 300 of a display device according to an example embodiment of the present invention includes a display area DA which is an area displaying an image (e.g., an area configured to display an image), and a peripheral area PA therearound when viewed from above. On the contrary, when viewed from a cross-sectional view, the display panel 300 of the display device according to the example embodiment of the present invention includes a lower substrate 110 and an upper substrate 210 facing each other.

The display area DA includes a plurality of signal lines, and a plurality of pixels PX connected to the signal lines and arranged substantially in a matrix form.

The signal lines may be provided on the lower substrate 110, and include a plurality of scanning signal lines G1-Gn transferring (e.g., configured to transfer) scanning signals, and a plurality of data lines D1-Dm transferring (e.g., configured to transfer) data voltages. The scanning signal lines G1-Gn extend substantially in a row direction and may extend parallel to each other, and the data lines D1-Dm extend substantially in a column direction and may extend parallel to each other.

Each pixel PX may include a switching element connected to at least one of the scanning signal lines G1-Gn and at least one of the data lines D1-Dm, at least one pixel electrode connected to the switching element, and an opposed electrode forming an electro-optical active layer, such as a light emitting element, together with the pixel electrode. In the case of an organic light emitting diode (OLED) display, a light emitting layer is positioned between the pixel electrode and the opposed electrode to form a light emitting element. The switching element may include at least one thin film transistor. The opposed electrode may transfer (e.g., may apply) a common voltage.

In order to implement a color display, each pixel PX may display one of the primary colors, and a desired color may be recognized by combining the primary colors. An example of the primary colors may include three primary colors or four primary colors such as red, green, blue, or the like. Each pixel PX may further include a color filter positioned at a space corresponding to each pixel electrode and expressing one of the primary colors, and the light emitting layer may be a color light emitting layer.

Referring to FIG. 2, the display device according to the example embodiment of the present invention, that is, as an organic light emitting diode (OLED) display, includes a plurality of signal lines 121, 171, and 172, and a plurality of pixels PX connected thereto and arranged substantially in a matrix form.

The signal lines include a scanning signal line 121, a data line 171, a plurality of driving voltage lines 172 transferring (e.g., configured to transfer) driving voltages, and the like.

Each pixel PX includes a switching transistor Qs, a driving transistor Qd, a storage capacitor Cst, and an organic light emitting element LD.

A control terminal of the switching transistor Qs is connected to the scanning signal line 121, an input terminal is connected to the data line 171, and an output terminal is connected to the driving transistor Qd. The switching transistor Qs transfers a data signal received from the data line 171 to the driving transistor Qd in response to a scanning signal received from the scanning signal line 121.

A control terminal of the driving transistor Qd is connected to the switching transistor Qs, an input terminal is connected to the driving voltage line 172, and an output terminal is connected to the organic light emitting element LD. The driving transistor Qd allows an output current $I_{LD}$ of varying size according to a voltage applied between the control terminal and the output terminal to flow.

The capacitor Cst is connected between the control terminal and the input terminal of the driving transistor Qd. The capacitor Cst charges a data voltage applied to the control terminal of the driving transistor Qd and maintains the charged data voltage (signal) even after the switching transistor Qs is turned off.

The organic light emitting element LD, for example, an organic light emitting diode (OLED), includes an anode connected to the output terminal of the driving transistor Qd and a cathode connected to a common voltage Vss. The organic light emitting element LD emits light of varying intensity according to the output current $I_{LD}$ of the driving transistor Qd to display an image.

The switching transistor Qs and the driving transistor Qd may be n-channel field effect transistors (FET), but at least one thereof may be a p-channel field effect transistor.

However, a connection relationship of the transistors Qs and Qd, the capacitor Cst, and the organic light emitting diode LD may be changed.

Referring to FIGS. 3 and 4, in a structure of the organic light emitting diode (OLED) display according to the example embodiment of the present invention, a buffer layer 111 may be positioned on the lower substrate 110 made of, for example, glass or plastic. The buffer layer 111 may prevent impurities from penetrating therethrough, and a surface thereof may be flat. The buffer layer 111 may include, for example, silicon nitride (e.g., $SiN_x$), silicon oxide (e.g., $SiO_2$), silicon oxynitride (e.g., $SiO_xN_y$), or the like. The buffer layer 111 may also be omitted.

A plurality of first semiconductors 154a and a plurality of second semiconductors 154b may be formed on the buffer layer 111. The first semiconductor 154a may include a channel region, a source region at one side of the channel region, and a drain region at another side of the channel region, the source region and the drain region being suitably doped, respectively. The second semiconductor 154b may include a channel region 152b, a source region 153b at one side of the channel region 152b, and a drain region 155b at another side of the channel region 152b, the source region 153b and the drain region 155b being suitably doped. The first semiconductor 154a and the second semiconductor 154b may include, for example, amorphous silicon, polysilicon, or oxide semiconductor.

A gate insulating layer 140 may be made of silicon nitride (e.g., $SiN_x$), silicon oxide (e.g., $SiO_2$), or the like and may be positioned on the first semiconductor 154a and the second semiconductor 154b.

A plurality of scanning signal lines 121 including a first control electrode 124a and a plurality of gate conductors including a second control electrode 124b are formed on the gate insulating layer 140.

The gate lines 121 may transfer gate signals and extend mainly in a horizontal direction. The first control electrode 124a may extend upward from (e.g., perpendicular to) the scanning signal line 121. The second control electrode 124b may be separated from the scanning signal line 121. The second control electrode 124b may include a storage electrode elongated in a vertical direction. The first control electrode 124a may overlap with a part of the first semiconductor 154a, particularly, the channel region 152b, and the second control electrode 124b may be overlap with a part of the second semiconductor 154b, particularly, the channel region 152b.

A first passivation layer 180a maybe positioned on the gate insulating layer 140 and the gate conductor. The first passivation layer 180a and the gate insulating layer 140 may include a contact hole 183a exposing the source region of the first semiconductor 154a, and a contact hole 185a exposing the drain region of the first semiconductor 154a, and a contact hole 183b exposing the source region 153b of the second semiconductor 154b, and a contact hole 185b exposing the drain region 155b of the second semiconductor 154b. The first passivation layer 180a may include a contact hole 184 exposing the second control electrode 124b.

A plurality of data conductors including a plurality of data lines 171, a plurality of driving voltage lines 172, a plurality of first output electrodes 175a, and a plurality of second output electrodes 175b may be formed on the first passivation layer 180a.

The data lines 171 may mainly extend in a vertical direction to cross the scanning signal lines 121. Each data line 171 may include a plurality of first input electrodes 173a extending toward the corresponding first control electrode 124a.

The driving voltage line 172 transfers a driving voltage and mainly extends in a vertical direction to cross the scanning signal line 121. Each driving voltage line 172 may include a plurality of second input electrodes 173b which extend toward the corresponding second control electrode 124b. In the case where the second control electrode 124b includes the storage electrode, the driving voltage line 172 may include a portion overlapped with the storage electrode.

The first and second output electrodes 175a and 175b may be separated from each other to have island shapes and are separated from the data line 171 and the driving voltage line 172. The first input electrode 173a and the first output electrode 175a may face each other on the first semiconductor 154a, and the second input electrode 173b and the second output electrode 175b may face each other on the second semiconductor 154b.

The first input electrode 173a and the first output electrode 175a may be connected to the source region and the drain region of the first semiconductor 154a through the contact holes 183a and 185a, respectively. The first output electrode 175a may be connected to the second control electrode 124b through the contact hole 184. The second input electrode 173b and the second output electrode 175b may be connected to the source region 153b and the drain region 155b of the second semiconductor 154b through the contact holes 183b and 185b, respectively.

The first control electrode 124a, the first input electrode 173a, and the first output electrode 175a form the switching transistor Qs together with the first semiconductor 154a; and the second control electrode 124b, the second input electrode 173b, and the second output electrode 175b form the driving transistor Qd together with the second semiconductor 154b. The structure of each of the switching transistor Qs and the driving transistor Qd is not limited thereto and may be variously modified.

A second passivation layer 180b made of, for example, an inorganic insulator (such as silicon nitride or silicon oxide) may be positioned on the data conductor. The second passivation layer 180b may have a flat surface by removing a step in order to increase light emission efficiency of the organic light emitting element to be formed thereon. The second passivation layer 180b may include a contact hole 185c exposing the second output electrode 175b.

A plurality of pixel electrodes 191 may be formed on the second passivation layer 180b.

The pixel electrode 191 of each pixel PX may be physically and electrically connected with the second output electrode 175b through the contact hole 185c of the second passivation layer 180b. The pixel electrode 191 may include, for example, a semi-transmissive conductive material or a reflective conductive material.

Referring to FIG. 4, a layer formed including a layer on the lower substrate 110, for example, the buffer layer 111 and layers up through a layer below the pixel electrode 191, for example, the second passivation layer 180b is called a transistor layer TFL.

A pixel defining layer 360 (e.g., a partition) having a plurality of openings exposing the pixel electrode 191 may be positioned on the second passivation layer 180b. The openings of the pixel defining layer 360 exposing the pixel electrode 191 may define each pixel area. The pixel defining layer 360 may also be omitted.

A light emitting member 370 is positioned on the pixel defining layer 360 and the pixel electrode 191. The light emitting member 370 may include a first organic common layer 371, a plurality of light emitting layers 373, and a second organic common layer 375 which are laminated (e.g., laminated in sequence).

The first organic common layer 371 may include, for example, at least one of a hole injecting layer and a hole transport layer which are laminated (e.g., laminated in sequence). The first organic common layer 371 may be formed across the entire display area in which the pixels PX are disposed, and may also be formed only in each pixel PX area.

The light emitting layer 373 may be positioned on the pixel electrode 191 of each corresponding pixel PX. The light emitting layer 373 may be made of an organic material which emits light of one of the primary colors such as red, green, or blue, and may have a structure in which a plurality of organic material layers emitting light of different colors are laminated. For example, a red organic light emitting layer may be laminated on the first organic common layer 371 of a pixel PX displaying (e.g., configured to display) red, a green organic light emitting layer may be laminated on the first organic common layer 371 of a pixel PX displaying (e.g., configured to display) green, and a blue organic light emitting layer may be laminated on the first organic common layer 371 of a pixel PX displaying (e.g., configured to display) blue. However, the present invention is not limited thereto, and an organic light emitting layer displaying one primary color may be laminated on the pixels displaying different colors. According to another example embodiment of the present invention, the light emitting layer 373 may also include a white light emitting layer displaying (e.g., configured to display) white.

The second organic common layer 375 may include, for example, at least one of an electron transport layer and an electron injecting layer which are laminated (e.g., laminated in sequence).

An opposed electrode 270 transferring a common voltage Vss may be formed on the light emitting member 370. The opposed electrode 270 may include, for example, a transparent conductive material. For example, the opposed electrode 270 may be made of a transparent conductive material, or formed by thinly depositing a metal such as calcium (Ca), barium (Ba), magnesium (Mg), aluminum (Al), silver (Ag), or the like having a light transmitting characteristic.

The pixel electrode 191, the light emitting member 370, and the opposed electrode 270 of each pixel PX form the light emitting element LD, and one of the pixel electrode 191 and the opposed electrode 270 is a cathode and the other is an anode. Further, the storage electrode and the driving voltage line 172 which are overlapped with each other may form the storage capacitor Cst.

An upper substrate 210 (e.g., an encapsulation substrate) is positioned above the opposed electrode 270. The upper substrate 210 encapsulates the light emitting member 370 and the opposed electrode 270, thereby preventing or reducing moisture and/or oxygen penetration from the outside. A distance between the opposed electrode 270 and the upper substrate 210 may be regular (e.g., substantially constant or uniform), and a sealing body 310 may be positioned between the opposed electrode 270 and the upper substrate 210.

Referring back to FIG. 1, the sealing body 310 may be positioned in the peripheral area PA where the lower substrate 110 and the upper substrate 210 face each other. For example, the sealing body 310 may be formed around the display area DA and may have a closed curve or rectangle shape. The sealing body 310 couples and fixes the lower substrate 110 and the upper substrate 210 and prevents or reduces impurities (such as external moisture, oxygen, or the like) from penetrating to be between the lower substrate 110 and the upper substrate 210 and encapsulates the electro-optical active layer, such as the light emitting element. In this case, the upper substrate 210 (e.g., the encapsulation substrate) prevents or reduces the electro-optical active layer, such as the light emitting element, from being exposed to external moisture or oxygen and protects the electro-optical active layer so that a characteristic thereof is not changed.

The sealing body 310 may include a frit having excellent moisture resistance and may also include an organic sealant and moisture absorbent. For example, the sealing body 310 may include a sealant which is positioned between the lower substrate 110 and the upper substrate 210 to couple (e.g., fuse) the lower substrate 110 and the upper substrate 210 by applying heat thereto. In this case, the heat may be applied by using an infrared lamp, a laser, or the like. The sealant may also include a light absorbent material which may absorb a laser, an infrared light, or the like. For example, the frit may generally use an oxide powder included in a glass powder and may include an organic material so as to be a paste (e.g., in a paste-like state). When the frit, coated between the lower substrate 110 and the upper substrate 210, is melted or fired by applying the heat, the lower substrate 110 and the upper substrate 210 may be bonded to each other through the fired frit, and internal elements of the display device may be encapsulated (e.g., completely encapsulated).

The sealing body 310 may include a plurality of portions extending in different directions, and in the example embodiment, respective to the display area DA, a right portion 310a is positioned at the right side, a left portion 310b is positioned at the left side, an upper portion 310c is positioned at the upper side, and a lower portion 310d is positioned at the lower side. The right portion 310a, the left portion 310b, the upper portion 310c, and the lower portion 310d of the sealing body 310 together form a closed curve or rectangle shape.

According to an example embodiment of the present invention, at least one of the right portion 310a, the left portion 310b, the upper portion 310c, and the lower portion 310d of the sealing body 310 has a different deposition structure from at least one of the remaining portions. For example, in a manufacturing process of the display device, in the case where a thickness of the sealant according to a position on the sealing body 310 is changed during a melting process of the sealant included in the sealing body 310, deposition structures of portions of the sealing body 310 may be different from each other at two portions of the sealing body 310 such that the corresponding sealants may have different thicknesses. Accordingly, even under the condition in which the thickness of the sealant may vary during the manufacturing process, the thickness of the sealing body 310 itself may remain substantially uniform and thus the distance between the lower substrate 110 and the upper substrate 210 may be substantially uniform. As a result, the Newton's ring phenomenon generated when a deviation occurs in the distance between the lower substrate 110 and the upper substrate 210, which are closely adjacent to each other may be prevented. A structure of the sealing body 310 will be described below in further detail.

The peripheral area PA may include a part of the lower substrate 110 which is not covered by the upper substrate 210 but is exposed. A driver 500 or a pad portion connected to the driver may be positioned on the exposed lower substrate 110. The driver 500 may include a scan driver transferring scanning signals to the scanning signal lines G1-Gn, a data driver transferring to data voltages to the data lines, or the like. The driver 500 may be directly installed on the lower substrate 110 in an IC chip form or installed on a flexible printed circuit film or a circuit board and attached to the lower substrate 110 in a tape carrier package (TCP) form.

Next, the display device including the sealing body 310 according to the example embodiment of the present invention will be described with reference to FIGS. 5 to 8 together with the drawings described above.

Figure 5:
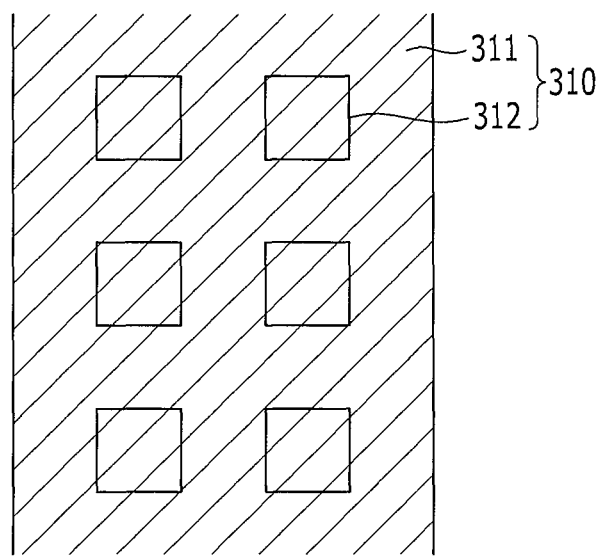
FIG. 5 is a plan view of a sealing body of the display device according to the example embodiment of the present invention.
Figure 6:
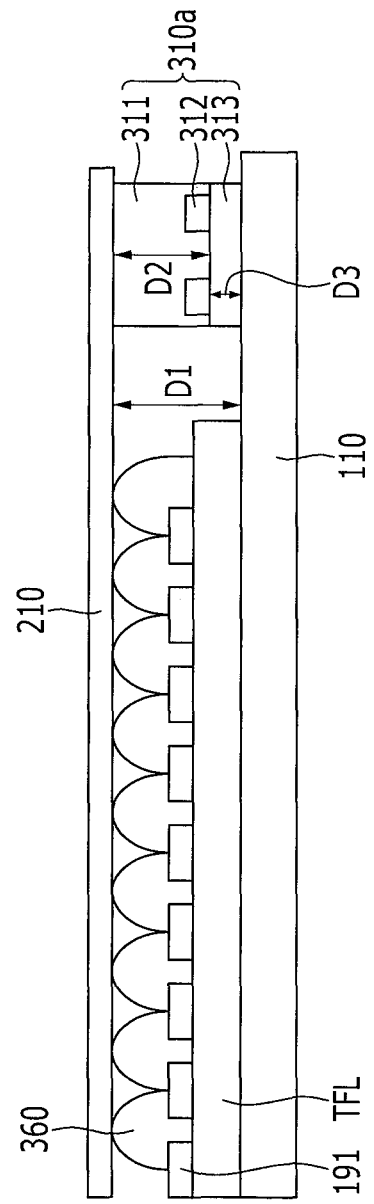
FIGS. 6 to 11 are cross-sectional views of one edge of the display device according to the example embodiment of the present invention, respectively.
Figure 7:
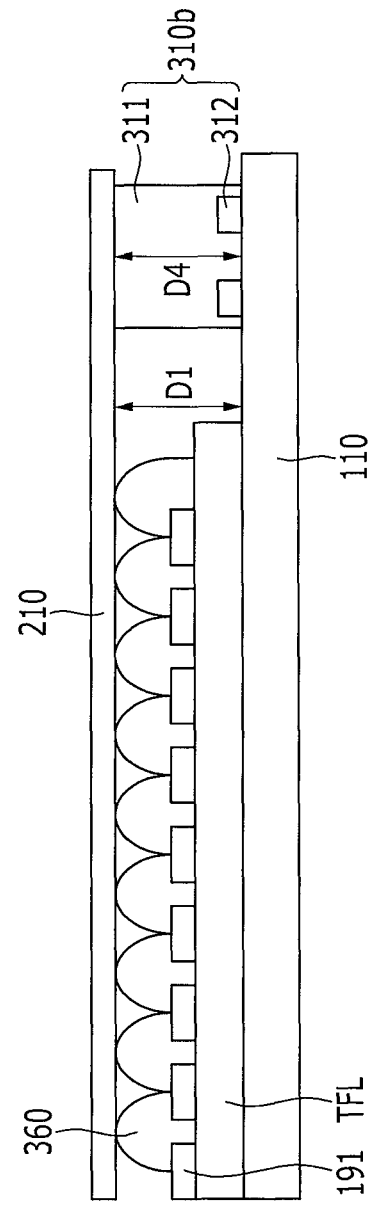
Figure 8:
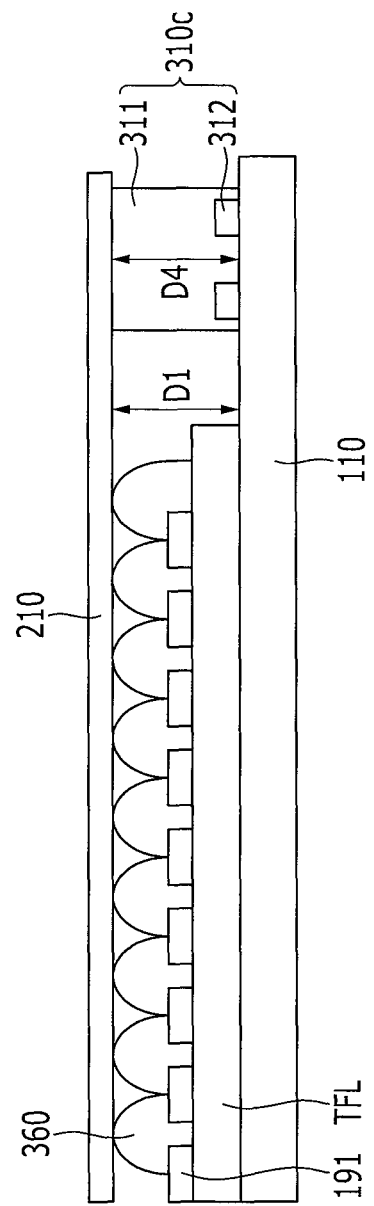

FIG. 5 is a plan view of a sealing body of the display device according to the example embodiment of the present invention, and FIGS. 6 to 8 are cross-sectional views of one edge of the display device according to the example embodiment of the present invention, respectively.

Referring to FIG. 5, the sealing body 310 of the display device according to the example embodiment of the present invention includes a sealant 311 which may fuse the lower substrate 110 and the upper substrate 210. The sealant 311 may include a frit.

At least one of the right portion 310a, the left portion 310b, the upper portion 310c, and the lower portion 310d of the sealing body 310 may include a plurality of first patterns 312. The first pattern 312 having an island shape may be positioned between the sealant 311 and the lower substrate 110 and may allow the sealant 311 to be cured well.

The first pattern 312 may include a conductive material such as a metal and may be formed as a single layer or a multi-layer structure. The first pattern 312 may include the same layer as at least one conductive layer including, for example, a metal of the transistor layer TFL of the thin film transistor of the display area DA and the pixel 191, and the first pattern 312 may be formed by the same process as the conductive layer.

The first patterns 312 may be regularly disposed as illustrated in FIG. 5, but may be irregularly disposed unlike this. Further, the shape of the first pattern 312 is not limited to a rectangle and may have various shapes.

Referring to FIGS. 6 to 8, in the display area DA of the display device according to the example embodiment of the present invention, a transistor layer TFL including a transistor is positioned on the lower substrate 110, a plurality of pixel electrodes 191 are positioned thereon, and a pixel defining layer 360 positioned between adjacent pixels PX may be positioned thereon. A light emitting member and an opposed electrode on the pixel electrode 191 are omitted for convenience. The transistor layer TFL may include a plurality of conductive layers, an insulating layer, a semiconductor layer, and the like as described above. For example, the transistor layer TFL may have the same structure as the transistor layer TFL of the organic light emitting diode (OLED) display according to the example embodiment illustrated in FIGS. 3 and 4, described above.

Many insulating layers including, for example, the transistor layer TFL may be positioned even in the peripheral area PA.

The upper substrate 210 (e.g., the encapsulation substrate) may be positioned on or above the lower substrate 110 with the transistor layer TFL and the like, and the lower substrate 110 and the upper substrate 210 may be bonded to each other with the sealing body 310 therebetween in the peripheral area PA. A distance D1 between the lower substrate 110 and the upper substrate 210 in the display area DA may be, for example, approximately 6.2 μm, but is not limited thereto. Here, the distance D1 between the lower substrate 110 and the upper substrate 210 in the display area DA may be a distance between a top surface of the plurality of layers formed on the lower substrate 110 and a bottom surface of the upper substrate 210.

A plurality of layers including the transistor layer TFL between the lower substrate 110 and the upper substrate 210 in the display area DA is called a display element layer.

As described above, at least one of the right portion 310*a*, the left portion 310*b*, the upper portion 310*c*, and the lower portion 310*d* of the sealing body 310 may have a different deposition structure from at least one of the remaining portions.

FIGS. 6 to 8 illustrate examples of deposition structures of the right portion 310*a*, the left portion 310*b*, and the upper portion 310*c* of the sealing body 310 in the peripheral area PA where the driver 500 is not positioned, respectively. In the example embodiment, the deposition structure of the right portion 310*a* of the sealing body 310 may be different from the deposition structures of the left portion 310*b* and the upper portion 310*c*, and the deposition structures of the left portion 310*b* and the upper portion 310*c* may be the same as each other.

Referring to FIG. 6, the right portion 310*a* of the sealing body 310 may include a sealant 311, a first pattern 312, and a second pattern 313.

The sealant 311 may include a frit and may bond the lower substrate 110 and the upper substrate 210 to each other. At the right portion 310*a*, a height D2 of the sealant 311 may be less than the distance D1 between the lower substrate 110 and the upper substrate 210 in the display area DA.

The first pattern 312 and the second pattern 313 may be different layers and may be positioned below the sealant 311. As illustrated in FIG. 6, the second pattern 313 may be positioned below the first pattern 312 but may be reversely positioned.

The first pattern 312 having an island shape may be positioned between the sealant 311 and the lower substrate 110 and may include a conductive material such as a metal.

The second pattern 313 may be positioned between the sealant 311 and the lower substrate 110 and may be formed as a single layer or a multi-layer structure including at least one of a conductive material such as a metal, a semiconductor layer, or an organic or inorganic insulating material. The second pattern 313 may include the same material or layer as at least one of the layers between the lower substrate 110 and the upper substrate 210 in the display area DA, that is, at least one of the plurality of conductive layers of the display element layer including the transistor layer TFL with the thin film transistor, the semiconductor layer, or the plurality of insulating layers, and may be formed by the same process as the layer.

For example, the second pattern 313 may be positioned on the same layer as the gate conductor and/or the gate insulating layer 140 and formed by the same process, and the first pattern 312 may be positioned on the same layer as the data conductor and formed by the same process.

A sum of a height D3 of the second pattern 313 and a height D2 of the sealant 311 may be substantially the same as the distance D1 between the lower substrate 110 and the upper substrate 210 in the display area DA.

Referring to FIGS. 7 and 8, the left portion 310*b* and the upper portion 310*c* of the sealing body 310 may include the sealant 311 and have the same structure as the right portion 310*a* illustrated in FIG. 6 and the first pattern 312 and the second pattern 313 may not be included.

At the left portion 310*b* and the upper portion 310*c* of the sealing body 310, a height D4 of the sealant 311 may be substantially the same as the distance D1 between the lower substrate 110 and the upper substrate 210 in the display area DA.

As such, in the manufacturing process of the organic light emitting diode (OLED) display, in the case where a difference or deviation in height of the sealant 311 occurs, an additional second pattern 313 described above may be further formed at a portion where the height of the sealant 311 is relatively small. As a result, the distance between the lower substrate 110 and the upper substrate 210 may remain substantially uniformly, and generation of the Newton's ring may be reduced or prevented. In this case, the second pattern 313 may be concurrently (e.g., simultaneously) formed when at least one of the many conductive layers or many insulating layers of the display area DA is formed, and according to a desired or required thickness of the second pattern 313, the second pattern 313 may be formed as a single layer or a multi-layer structure.

In the example embodiment illustrated in FIGS. 6 to 8, during the bonding process of the lower substrate 110 and the upper substrate 210, when the sealant 311 is melted by applying heat, such as by a laser, to the sealant 311, as an example, the heights of the sealants 311 at the left portion 310*b* and the upper portion 310*c* may be greater than the height of the right portion 310*a* of the sealing body 310.

Next, the display device including the sealing body 310 according to another example embodiment of the present invention will be described with reference to FIGS. 9 to 12 together with the drawings described above. The same constituent elements as the example embodiments described above designate the same reference numerals, and the duplicated description will be omitted.

Figure 9:
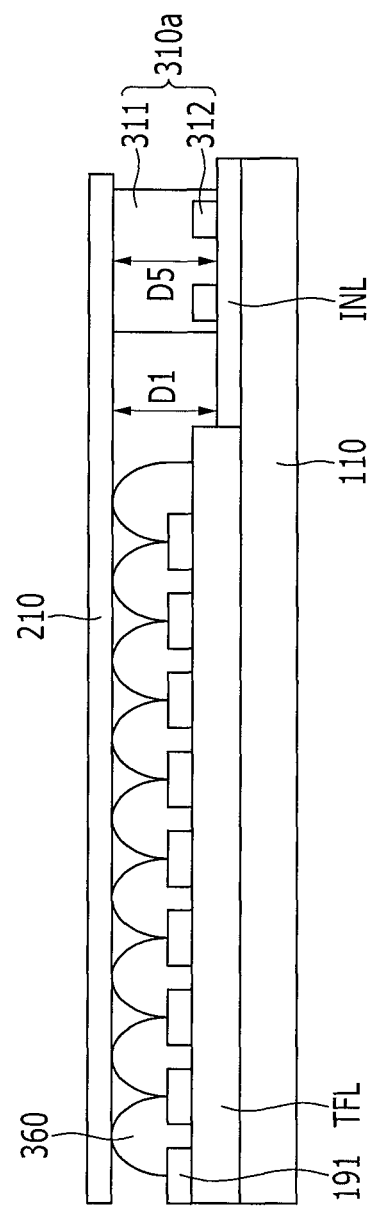
Figure 10:
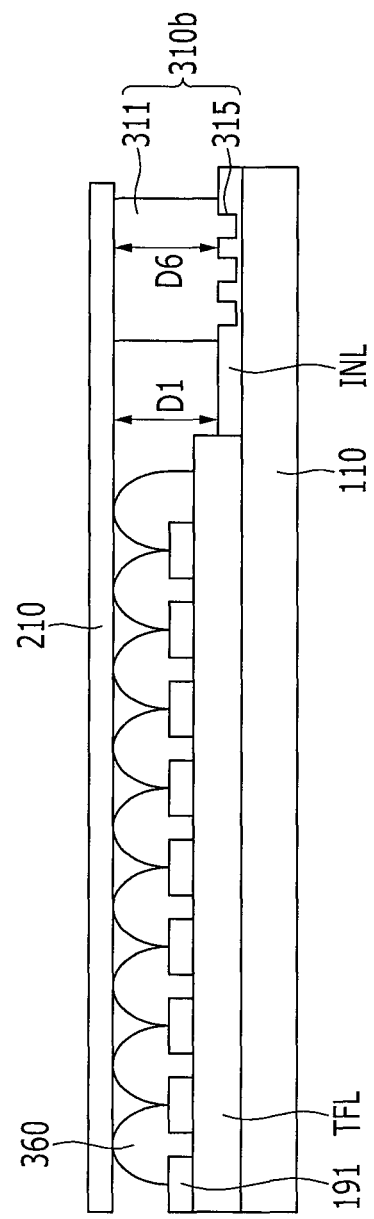
Figure 11:
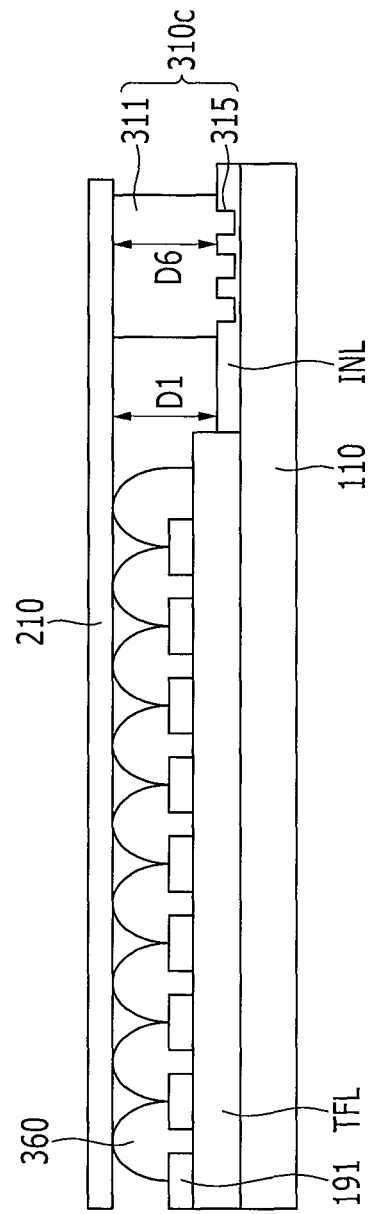
Figure 12:
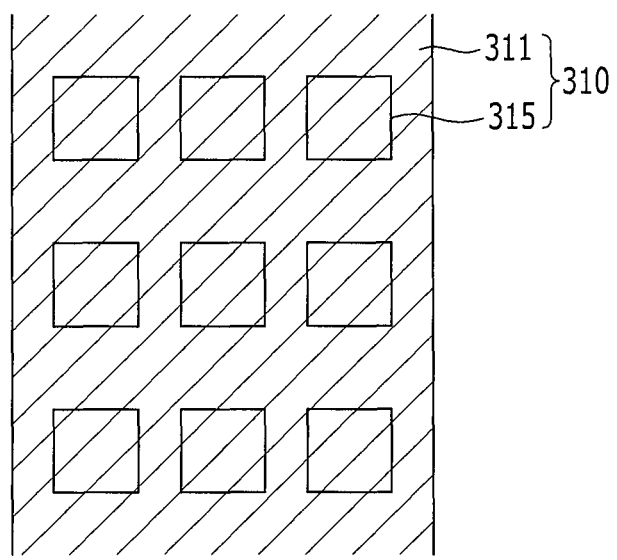
FIG. 12 is a plan view of a sealing body of the display device according to an example embodiment of the present invention.

FIGS. 9 to 11 are cross-sectional views of one edge of the display device according to the example embodiment of the present invention, respectively, and FIG. 12 is a plan view of a sealing body of the display device according to the example embodiment of the present invention.

Referring to FIGS. 9 to 11, in the display area DA of the display device according to the example embodiment of the present invention, a transistor layer TFL including a transistor is positioned on the lower substrate 110, a plurality of pixel electrodes 191 is positioned thereon, and a pixel defining layer 360 positioned between adjacent pixels PX may be positioned thereon. The transistor layer TFL may include a plurality of conductive layers, a semiconductor layer, an insulating layer, and the like. For example, the transistor layer TFL may have the same structure as the transistor layer TFL of the organic light emitting diode (OLED) display according to the example embodiment illustrated in FIGS. 3 and 4 described above.

At least one layer of many insulating layers of the display element layer including the transistor layer TFL may extend even into the peripheral area PA to form a peripheral insulating layer INL.

The upper substrate 210 (e.g., the encapsulation substrate) is positioned on or above the lower substrate 110 with the transistor layer TFL and the like, and the lower substrate 110 and the upper substrate 210 are bonded to each other with the sealing body 310 in the peripheral area PA. A distance D1 between the lower substrate 110 and the upper substrate 210 in the display area DA may be, for example, approximately 6.2 μm, but is not limited thereto.

As described above, at least one of the right portion 310*a*, the left portion 310*b*, the upper portion 310*c*, and the lower portion 310*d* of the sealing body 310 may have a different deposition structure from at least one of the remaining portions.

Even in the example embodiment illustrated in FIGS. 9 to 12, during the bonding process of the lower substrate 110 and the upper substrate 210, when the sealant 311 is melted by applying heat, such as by a laser, to the sealant 311, as an example, the heights of the sealants 311 at the left portion 310b and the upper portion 310c may be greater than the height of the right portion 310a of the sealing body 310.

FIGS. 9 to 11 illustrate examples of deposition structures of the right portion 310a, the left portion 310b, and the upper portion 310c of the sealing body 310 in the peripheral area PA where the driver 500 is not positioned, respectively. Even in the example embodiment, the deposition structure of the right portion 310a of the sealing body 310 may be different from the deposition structures of the left portion 310b and the upper portion 310c, and the deposition structures of the left portion 310b and the upper portion 310c may be the same as each other.

Referring to FIG. 9, the right portion 310a of the sealing body 310 may include the sealant 311 and the first pattern 312. The sealant 311 may include a frit and may bond the lower substrate 110 and the upper substrate 210 to each other. The first pattern 312, having an island shape, may be positioned between the sealant 311 and the lower substrate 110 and may include a conductive material such as a metal. In FIG. 9, the first pattern 312 is positioned above the peripheral insulating layer INL for convenience, but is not limited thereto, and the first pattern 312 may be positioned in the peripheral insulating layer INL (e.g., in the middle of the peripheral insulating later INL) and may also be positioned therebelow. Further, in the case where the first pattern 312 is formed as a multi-layer structure, the first pattern 312 may be divided and positioned on several layers in the peripheral insulating layer INL.

At the right portion 310a, a height D5 of the sealant 311 may be substantially the same as the distance D1 between the lower substrate 110 and the upper substrate 210 in the display area DA.

According to another example embodiment of the present invention, the right portion 310a of the sealing body 310 may also not include the first pattern 312 according to a desired or required thickness.

Referring to FIGS. 10 and 11, the left portion 310b and the upper portion 310c of the sealing body 310 may include a sealant 311 and a third pattern 315. As illustrated above, the left portion 310b and the upper portion 310c of the sealing body 310 may not include the first pattern 312, and unlike this, may also include the first pattern 312 according to a desired or required thickness.

Referring to FIG. 12, the third pattern 315 may include a plurality of openings formed by removing a part of the peripheral insulating layer INL. For example, the third pattern 315 may include an opening formed in at least one of the gate insulating layer 140, the first passivation layer 180a, and the second passivation layer 180b according the example embodiments described above.

The third pattern 315 may be concurrently (e.g., simultaneously) formed when the insulating layer of the display element layer of the display area DA is patterned. For example, when the peripheral insulating layer INL includes at least one of the gate insulating layer 140, the first passivation layer 180a, and the second passivation layer 180b, the third pattern 315 may be concurrently (e.g., simultaneously) formed when a contact hole is formed in the insulating layer 140.

As such, when the openings are formed in the peripheral insulating layer INL, the height of the sealant 311 thereabove may be decreased depending on a size (e.g., a depth) of the third pattern 315.

At the left portion 310b and the upper portion 310c of the sealing body 310, a height D6 of the sealant 311 may be substantially the same as the distance D1 between the lower substrate 110 and the upper substrate 210 in the display area DA.

As such, in the manufacturing process of the organic light emitting diode (OLED) display, when a difference in height of the sealant 311 occurs according to a position on the sealing body 310, the third pattern 315 may be further formed at a portion of the sealant 311 having a relatively large height as described above to maintain a substantially uniform distance between the lower substrate 110 and the upper substrate 210. In this case, the third pattern 315 may be concurrently (e.g., simultaneously) formed when at least one of many insulating layers in the display area DA is patterned, and by considering the height of the sealant 311, a kind and the number of insulating layers to be formed with the third pattern 315 may be determined.

Next, the display device including the sealing body 310 according to another example embodiment of the present invention will be described with reference to FIG. 13 together with the drawings described above.

Figure 13:
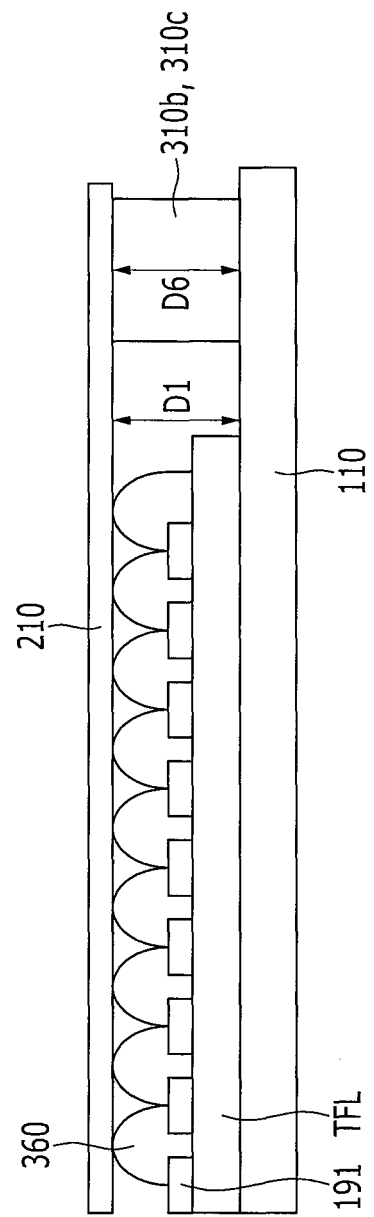
FIG. 13 is a cross-sectional view of one edge of the display device according to another example embodiment of the present invention.

FIG. 13 is a cross-sectional view of one edge of the display device according to the another example embodiment of the present invention.

Referring to FIG. 13, the display device according to the example embodiment of the present invention is similar to the example embodiment illustrated in FIGS. 6 to 8 and the example embodiment illustrated in FIGS. 9 to 11, described above, but the left portion 310b and the upper portion 310c of the sealing body 310 may be different. For example, the right portion 310a of the sealing body 310 may include at least one of the first pattern 312 and the second pattern 313, but the left portion 310b and the upper portion 310c of the sealing body 310 may not include any one of the first pattern 312 and the second pattern 313. In this case, at the left portion 310b and the upper portion 310c, a height D6 of the sealant 311 may be substantially the same as the distance D1 between the lower substrate 110 and the upper substrate 210 in the display area DA.

In the several example embodiments illustrated in FIGS. 6 to 13 described above, heights, volumes, or the like of the first pattern 312, the second pattern 313, and the third pattern 315 included in the sealing body 310 may be controlled (e.g., properly controlled) to maintain a substantially uniform distance D1 between the lower substrate 110 and the upper substrate 210 in the display area DA.

Next, a manufacturing method of a display device according to an example embodiment of the present invention will be described with reference to FIGS. 14 to 20.

Figure 14:
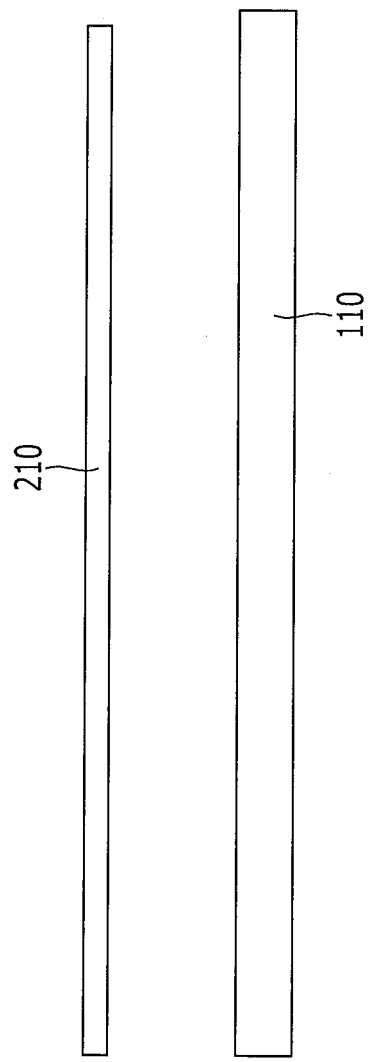
FIGS. 14 to 20 are cross-sectional views illustrating intermediate acts of a manufacturing method of a display device according to an example embodiment of the present invention.
Figure 15:
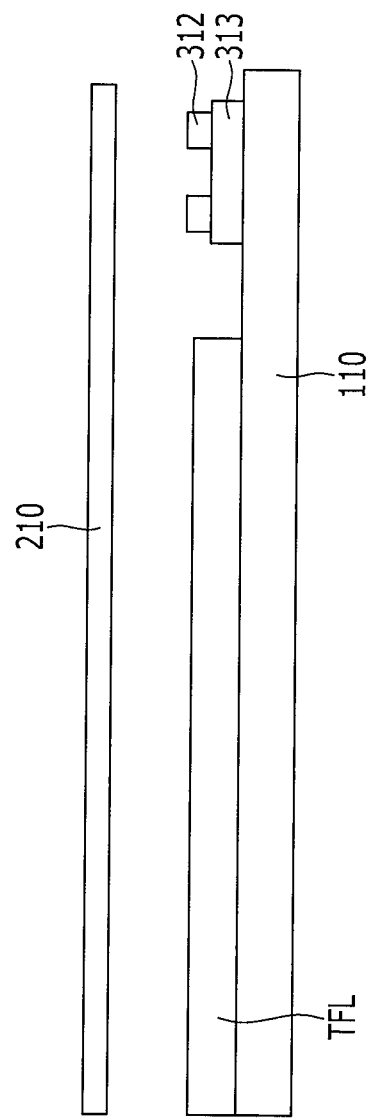
Figure 16:
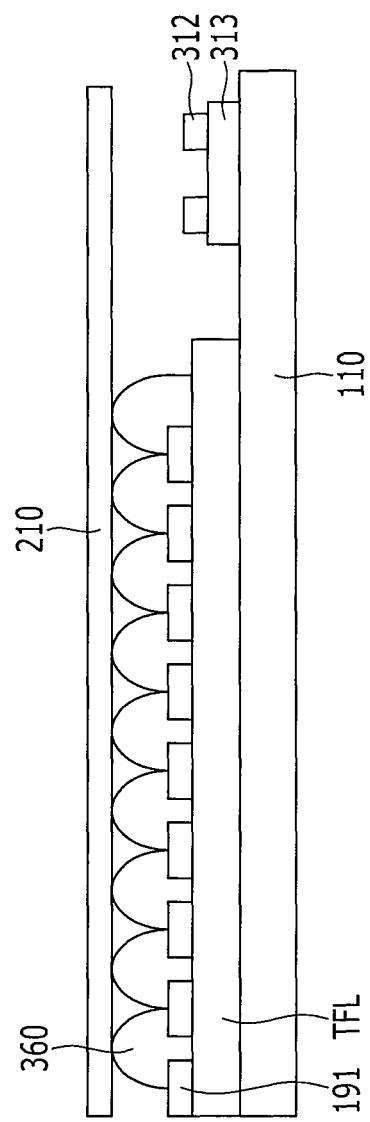
Figure 17:
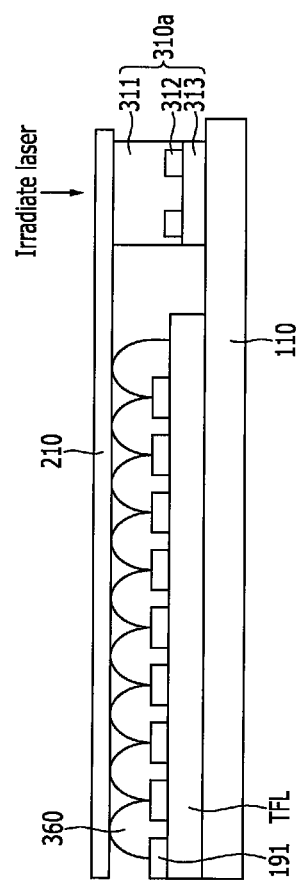
Figure 18:
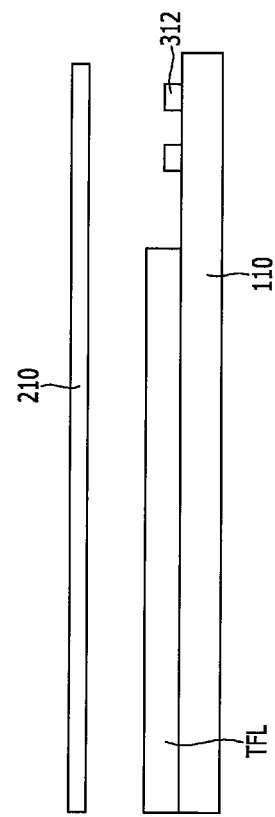
Figure 19:
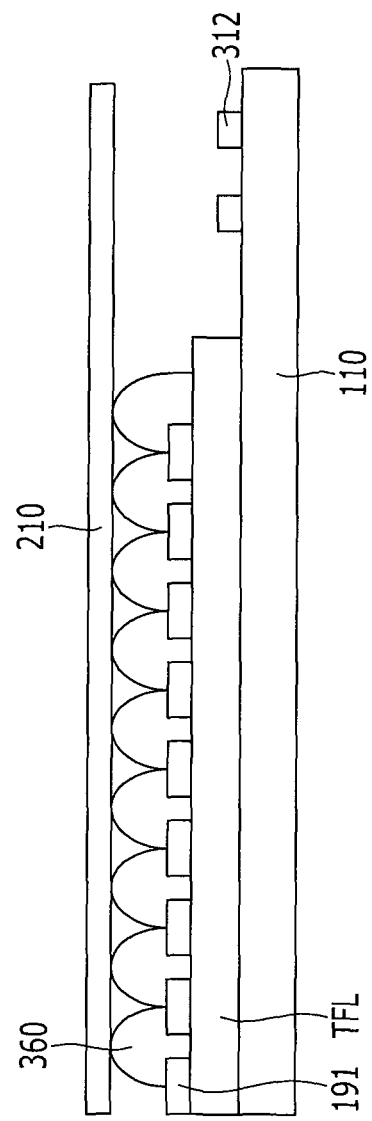
Figure 20:
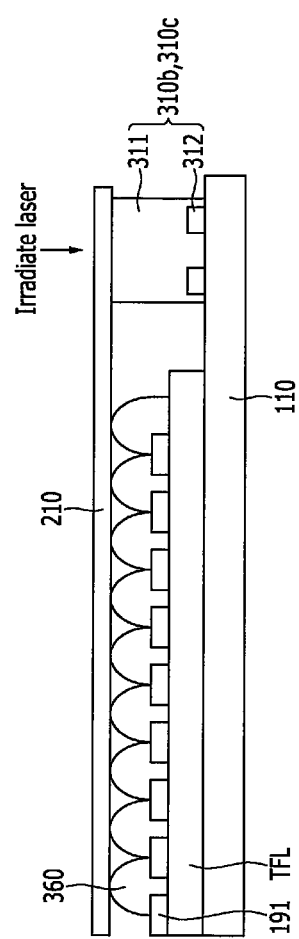

FIGS. 14 to 20 are cross-sectional views illustrating intermediate acts of a manufacturing method of a display device according to an example embodiment of the present invention. Particularly, FIGS. 15 to 17 are cross-sectional views of the right portion 310a of the sealing body 310, and FIGS. 18 to 20 are cross-sectional views of the left portion 310b and the upper portion 310c of the sealing body 310.

First, referring to FIG. 14, the lower substrate 110 and the upper substrate 210 are prepared, respectively.

Next, referring to FIGS. 15 and 18, a plurality of conductive layers, an insulating layer, a semiconductor layer, and the like are laminated and patterned on the lower substrate 110 to form a transistor layer TFL in a display area DA, to form a second pattern 313 and a first pattern 312 in a right region of a peripheral area PA, and to form the first pattern 312 in left and upper regions of the peripheral area PA.

Next, referring to FIGS. 16 and 19, a plurality of pixel electrodes 191 and a pixel defining layer 360 are formed on a transistor layer TFL of the display area DA, and a light emitting member and an opposed electrode are formed thereon.

Next, referring to FIGS. 17 and 20, a sealant 311 is coated on the peripheral area PA of the lower substrate 110 or the upper substrate 210 to surround the display area DA. Next, the lower substrate 110 and the upper substrate 210 are arranged and bonded to each other and then the sealant 311 is cured by applying heat to the sealant 311. In this case, the sealant 311 may be sequentially cured by irradiating a laser to the sealant 311. The laser may be irradiated along any one direction of the sealant 311 formed as a closed curve or rectangle, and in the example embodiment, for example, the laser is irradiated in a clockwise direction or a counterclockwise direction from the right region of the peripheral area PA. In this case, the sealant 311 may be pushed (e.g., may migrate) toward a region yet to be irradiated from a region that has been irradiated and thus the height of the sealant 311 may be increased along the direction the laser is irradiated.

According to an example embodiment of the present invention, even though the height of the sealant 311 may change according to a position on the sealing body 310, the second pattern 313 formed at a portion of the sealing body 310 having a smaller height is positioned below the sealant 311, thereby compensating for a difference in height of the sealant 311 and maintaining a substantially uniform distance between the lower substrate 110 and the upper substrate 210.

Next, a manufacturing method of a display device according to another example embodiment of the present invention will be described with reference to FIGS. 21 to 24.

Figure 21:
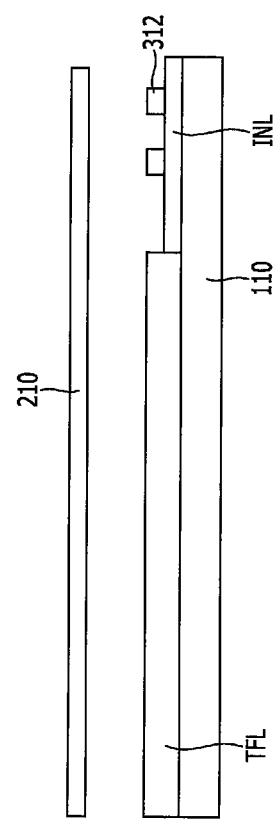
Figure 22:
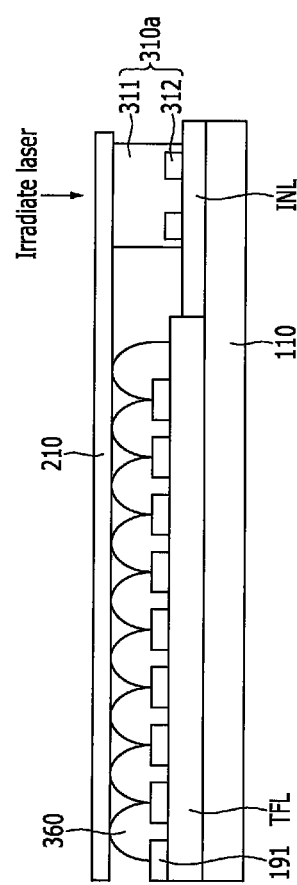

FIGS. 21 to 24 are cross-sectional views illustrating intermediate acts of a manufacturing method of a display device according to an example embodiment of the present invention. Particularly, FIGS. 21 and 22 are cross-sectional views of the right portion 310a of the sealing body 310, and FIGS. 23 and 24 are cross-sectional views of the left portion 310b and the upper portion 310c of the sealing body 310.

First, referring to FIGS. 21 and 23, after the lower substrate 110 and the upper substrate 210 are prepared, respectively, a plurality of conductive layers, an insulating layer, a semiconductor layer, and the like are laminated and patterned on the lower substrate 110 to form a transistor layer TFL in a display area DA. In this case, at least one of various insulating layers of a display element layer including the transistor layer TFL is formed in the peripheral area PA to form a peripheral insulating layer INL. Further, when the insulating layer of the transistor layer TFL is patterned, at least some layers of the peripheral insulating layer INL in the peripheral area PA may be patterned together to form a third pattern 315 in the left and upper regions of the peripheral area PA. Further, a first pattern 312 may be formed in a right region of the peripheral area PA. As described above, the first pattern 312 may be positioned in the peripheral insulating layer INL (e.g., in the middle of the peripheral insulating layer INL), and may also be positioned therebelow. Further, in the case where the first pattern 312 is formed as a multi-layer structure, the first pattern 312 may be divided and positioned on several layers in the peripheral insulating layer INL.

Next, referring to FIGS. 22 and 24, a plurality of pixel electrodes 191 and a pixel defining layer 360 are formed on a transistor layer TFL of the display area DA, and a light emitting member and an opposed electrode are formed thereon. Next, a sealant 311 is coated on the peripheral area PA of the lower substrate 110 or the upper substrate 210 to substantially surround the display area DA. Next, the lower substrate 110 and the upper substrate 210 are arranged and bonded to each other and then the sealant 311 is cured by applying heat to the sealant 311. In this case, the sealant 311 may be sequentially cured by irradiating a laser to the sealant 311. The laser may be irradiated along any one direction of the sealant 311 formed as a closed curve or rectangle, and in the example embodiment, for example, the laser is irradiated in a clockwise direction or a counterclockwise direction from the right region of the peripheral area PA. In this case, the sealant 311 may be pushed (e.g., may migrate) toward a region yet to be irradiated from a region that has been irradiated and thus the height of the sealant 311 may be increased along the direction the laser is irradiated.

According to an example embodiment of the present invention, even though the height of the sealant 311 may be changed according to a position on the sealing body 310, the third pattern 315 formed at a portion of the sealant body 310 having a greater height is positioned below the sealant 311, thereby decreasing the height of the sealant 311 at that position, compensating for a difference in the height of the sealant 311 and maintaining a substantially uniform distance between the lower substrate 110 and the upper substrate 210.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims and their equivalents.

| Description of symbols | |
|---|---|
| 110: Lower substrate | 121: Scanning signal line |
| 140: Gate insulating layer | 171: Data line |
| 172: Driving voltage line | 180a, 180b: Passivation layer |
| 191: Pixel electrode | 210: Upper substrate |
| 270: Opposed electrode | 310: Sealing body |
| 311: Sealant | 312: First pattern |
| 313: Second pattern | 315: Third pattern |
| 360: Pixel defining layer | 370: Light emitting member |
| 500: Driver | |

What is claimed is:

1. A display device comprising:
a lower substrate;
an upper substrate facing the lower substrate;
a display element layer in a display area of the lower substrate and comprising a thin film transistor; and
a sealing body in a peripheral area surrounding the display area, having a closed curve shape, and between the lower substrate and the upper substrate,
wherein:
the sealing body comprises a first portion and a second portion, the first portion and the second portion respectively extending along different directions, and a sealant coupling the lower substrate and the upper substrate,
the sealant at the first portion and the sealant at the second portion are different in height from each other, and
the first portion and the second portion respectively have different deposition structures.

2. The display device of claim 1, wherein:
the first portion comprises a first pattern, and
the second portion does not comprise the first pattern.

3. The display device of claim 2, wherein:
the first pattern comprises a pattern that is at least one layer of the display element layer.

4. The display device of claim 3, wherein:
the first pattern further comprises a layer that is at least one of a conductive layer, a semiconductor layer, and an insulating layer, and
the at least one of the conductive layer, the semiconductor layer, and the insulating layer are in the display element layer.

5. The display device of claim 4, wherein:
the sealant at the first portion is less in height than that of the sealant at the second portion.

6. The display device of claim 5, wherein:
the first portion and the second portion each further comprise a second pattern comprising a metal.

7. The display device of claim 6, wherein:
the sealant comprises a frit.

8. The display device of claim 3, further comprising:
a peripheral insulating layer between the sealant and the lower substrate wherein,
the peripheral insulating layer is at least one insulating layer of the display element layer, and
the first pattern comprises an opening in the peripheral insulating layer.

9. The display device of claim 8, wherein:
the second portion further comprises a second pattern comprising a metal.

10. The display device of claim 9, wherein:
the sealant comprises a frit.

11. A manufacturing method of a display device, the method comprising:
providing a lower substrate and an upper substrate that include a display area and a peripheral area around the display area; and
forming a sealing body between the lower substrate and the upper substrate, the sealing body having a closed curve shape surrounding the display area and positioned in the peripheral area, the forming of the sealing body comprising:
coating a sealant to couple the lower substrate and the upper substrate with each other on the lower substrate or the upper substrate; and
curing the sealant,
wherein:
the sealing body comprises a first portion and a second portion, the first portion and the second portion respectively extending along different directions, and the first portion and the second portion respectively have different deposition structures, and
the cured sealant at the first portion and the cured sealant at the second portion are different in height from each other.

12. The manufacturing method of claim 11, wherein:
the forming of the sealing body further comprises forming a first pattern in the first portion but not in the second portion.

13. The manufacturing method of claim 12, further comprising:
forming a display element layer comprising a thin film transistor in the display area of the lower substrate,
wherein the first pattern is formed utilizing a same process as at least one layer of the display element layer.

14. The manufacturing method of claim 13, wherein:
the first pattern comprises a layer that is at least one of a conductive layer, a semiconductor layer, and an insulating layer, and
the at least one of the conductive layer, the semiconductor layer, and the insulating layer are in the display element layer.

15. The manufacturing method of claim 14, wherein:
after the curing of the sealant, the sealant at the first portion is less in height than that of the sealant at the second portion.

16. The manufacturing method of claim 13, wherein:
the forming of the display element layer comprises forming a peripheral insulating layer between the sealant and the lower substrate, the peripheral insulating layer is at least one insulating layer of the display element layer, and
the first pattern has an opening in the peripheral insulating layer.

17. The manufacturing method of claim 16, wherein:
the first pattern is formed when the at least one insulating layer of the display element layer is patterned.

18. The manufacturing method of claim 11, wherein:
the sealant comprises a frit.

* * * * *